(12) United States Patent
Shepherd

(10) Patent No.: US 8,175,560 B2
(45) Date of Patent: May 8, 2012

(54) METHOD AND SYSTEM FOR TUNING AN ANTENNA

(75) Inventor: John Shepherd, Blagnac (FR)

(73) Assignee: Freescale Semiconductor, Inc., Austin, TX (US)

( * ) Notice: Subject to any disclaimer, the term of this patent is extended or adjusted under 35 U.S.C. 154(b) by 904 days.

(21) Appl. No.: 12/282,542

(22) PCT Filed: Mar. 16, 2006

(86) PCT No.: PCT/EP2006/004033
§ 371 (c)(1),
(2), (4) Date: Sep. 11, 2008

(87) PCT Pub. No.: WO2007/104343
PCT Pub. Date: Sep. 20, 2007

(65) Prior Publication Data
US 2009/0091503 A1      Apr. 9, 2009

(51) Int. Cl.
*H04B 1/18* (2006.01)
(52) U.S. Cl. .................................. 455/193.1; 455/195.1
(58) Field of Classification Search ............... 455/193.1, 455/195.1, 150.1, 280, 334
See application file for complete search history.

(56) References Cited

U.S. PATENT DOCUMENTS

| | | | |
|---|---|---|---|
| 5,483,688 A | | 1/1996 | English et al. |
| 5,491,715 A | * | 2/1996 | Flaxl .............................. 375/344 |
| 5,990,841 A | | 11/1999 | Sakamoto et al. |
| 5,991,609 A | * | 11/1999 | Marrah et al. ............. 455/182.2 |
| 6,606,069 B2 | | 8/2003 | Kitamura et al. |

FOREIGN PATENT DOCUMENTS

| | | |
|---|---|---|
| EP | 1376853 A1 | 1/2004 |
| EP | 1471602 A1 | 10/2004 |
| JP | 60097728 A | 5/1985 |
| WO | 9808645 | 3/1998 |

* cited by examiner

*Primary Examiner* — Nguyen Vo

(57) ABSTRACT

Method and system for tuning a tunable antenna uses a comparison between a signal response at two different tuning frequencies to determine how or if the tuning needs to be further adjusted. With the approach, the method and system arrive at a frequency shift that is centered about the desired antenna frequency, which point there is no net change in the signal response. In a further aspect, a frequency to which a tuned antenna is tuned is shifted to verify whether the antenna is still in tune. Modifications to minimize disturbance of the output received signal that would otherwise be caused by the frequency shifting are contemplated.

20 Claims, 9 Drawing Sheets

METHOD AND SYSTEM FOR TUNING AN ANTENNA

FIELD OF THE INVENTION

The present invention relates to a method and system for iteratively tuning an antenna, particularly a narrow-band antenna. A particular example of the present invention relates to a method and system of automatically and dynamically tuning such an antenna.

BACKGROUND OF THE INVENTION

To receive terrestrial television transmissions, especially digital video broadcasting (such as DVB-T and DVB-H), in a portable or mobile environment, a compact omni-directional wideband antenna covering the UHF TV band (470-860 MHz) is desirable. Reference herein to "wideband" is meant to refer to a situation in which a desired tuning range of the antenna is many times the bandwidth of the antenna. Such an antenna is difficult to implement, especially if an antenna having minimal gain is desired.

It is conventionally considered easier to construct a narrowband antenna having, for example, a dipole, loop, patch, or meander structure. Such antennas can be tuned either electrically (using variable reactance) or mechanically (by varying the length of the elements) to cover the desired band. U.S. Pat. No. 6,606,069, for example, describes an electrically tuned antenna.

However, narrowband antennas must accurately track a desired signal frequency in order to avoid loss of gain. This can be difficult because a variety of factors can easily or rapidly cause detuning (such as the presence of a person, metallic objects, and the like in proximity to the antenna).

Conventional transceiver systems (such as short-wave marine radios) having a tunable antenna often use transmit mode tuning. That is, the antenna is tuned according to a signal being transmitted. More specifically, the antenna is tuned to achieve a maximum return loss (or minimum voltage standing wave ratio ("VSWR")). In the receive mode, the antenna keeps the same tuning as in the transmit mode. JP 60 097 728 generally describes a non-automatic system of this type.

If, however, the antenna becomes detuned in receive mode with respect to a received signal, the tuning cannot be readjusted to compensate without going into transmit mode. It will be appreciated that this issue becomes significant in many applications (such as transporting digital information (data, video, etc)) because the received signal is continuous and there is no feasible period when the receiver can be disconnected to allow retuning in the transmit mode. In particular, television receiver radiation emissions are strictly regulated such that applying even a very small signal into the antenna for transmit mode tuning is unlikely to be permissible.

SUMMARY OF THE INVENTION

In view of the foregoing, the present invention provides a method and system of for dynamically tuning an antenna as described in the claims appended hereto.

BRIEF DESCRIPTION OF THE DRAWINGS

Embodiments of the invention will now be more fully described, by example, with reference to the drawings, in which.

DETAILED DESCRIPTION OF PREFERRED EMBODIMENTS

Some preferred embodiments of the present invention are described hereinbelow.

Figure 1:
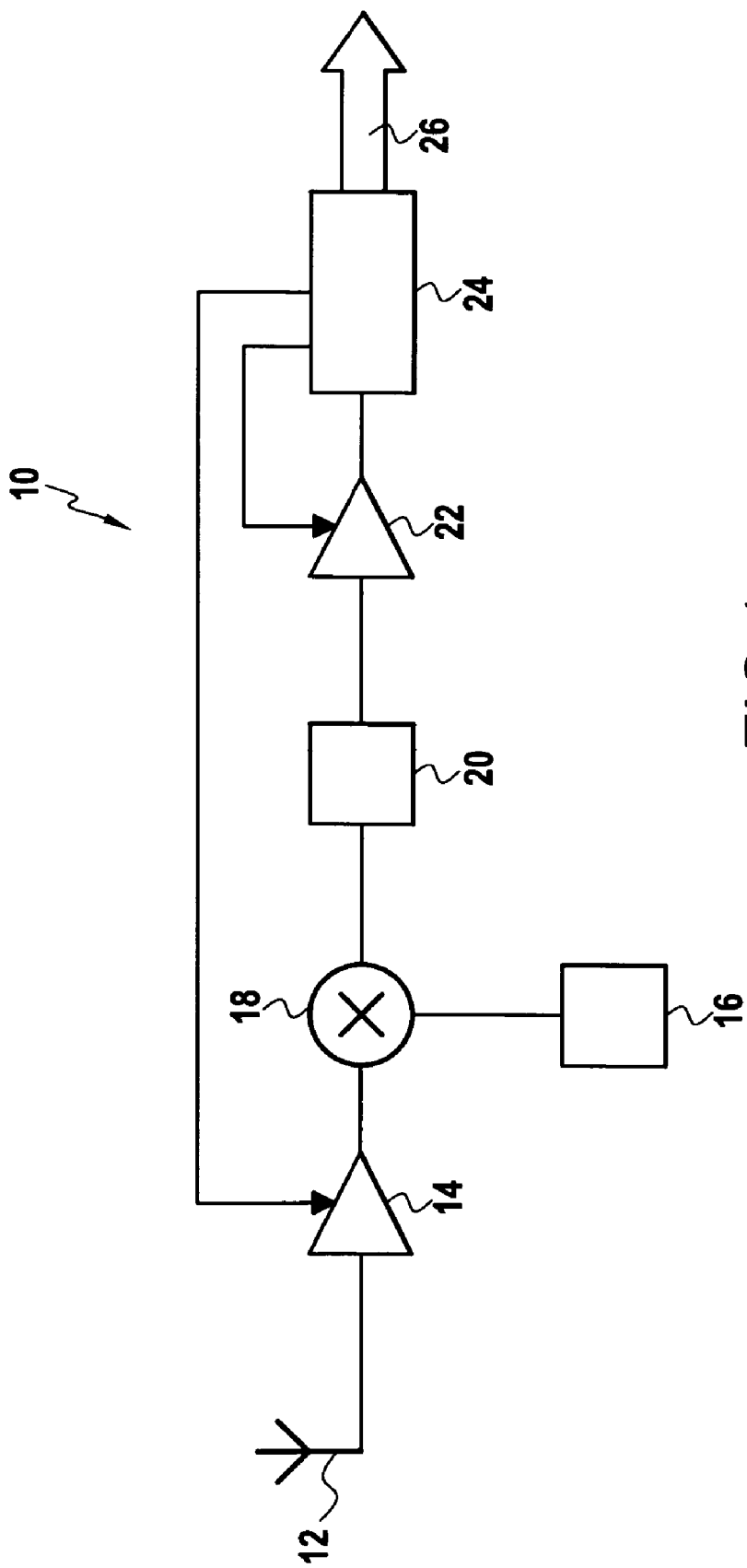
FIG. 1 illustrates conventional digital video broadcast tuner architecture (particularly, a DVB-H standard architecture)

FIG. 1 illustrates a general block diagram of a digital video broadcast (DVB) tuner (such as a DVB-H tuner). In general DVB tuner 10 includes an antenna 12 providing a signal to a pre-amplifier stage 14, such as a gain-controlled RF pre-amplifier. The pre-amplifier 14 and a local oscillator 16 both have outputs connected to a mixer 18. Local oscillator 16 is tunable to a given frequency for receiving a desired signal. The combined output from mixer 18 may be filtered by filter 20 and amplified by a variable gain amplifier 22 before being received by DVB decoder 24. Typically, the gains of pre-amplifier 14 and variable gain amplifier 22 are controlled by the DVB decoder 24, especially to provide automatic gain control. Thereafter, the DVB decoder 24 outputs the desired data stream 26.

Figure 2:
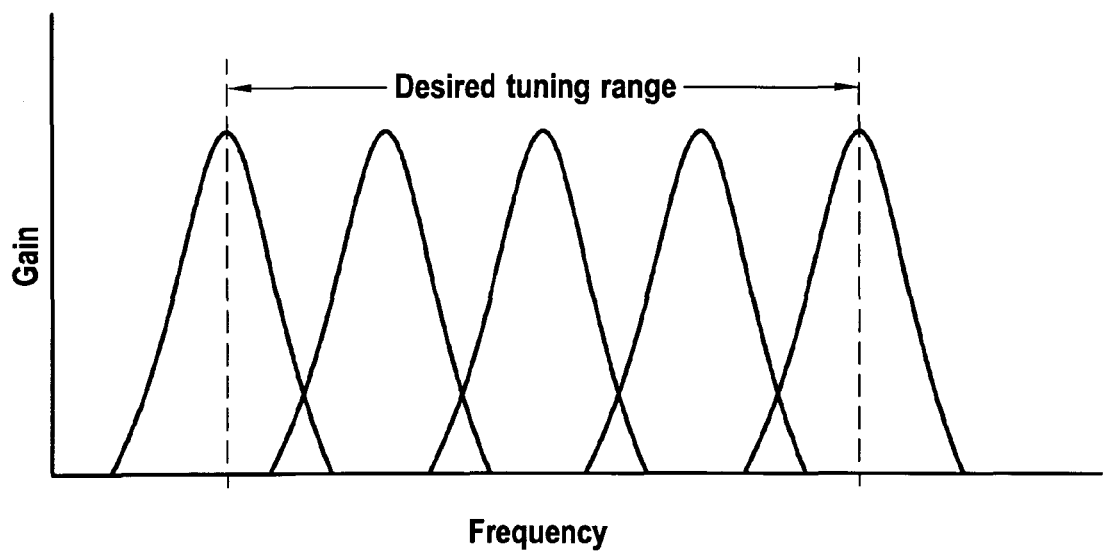
FIG. 2 generally illustrates the frequency response of a tunable narrowband antenna that can be used in the tuner architecture illustrated in FIG. 1.

FIG. 2 generally illustrates a tuning response profile for a tunable antenna, as a relationship between frequency and gain. As can be seen, a given signal has a corresponding frequency to which the antenna can be tuned to obtain a maximal gain response, and this gain response falls off to either side in a standard curve profile. That is, as the extent to which the antenna is mis-tuned increases, the signal quality deteriorates as illustrated by the curve. For the sake of visual clarity, only a few signal response curves are shown in FIG. 2.

Figure 3:
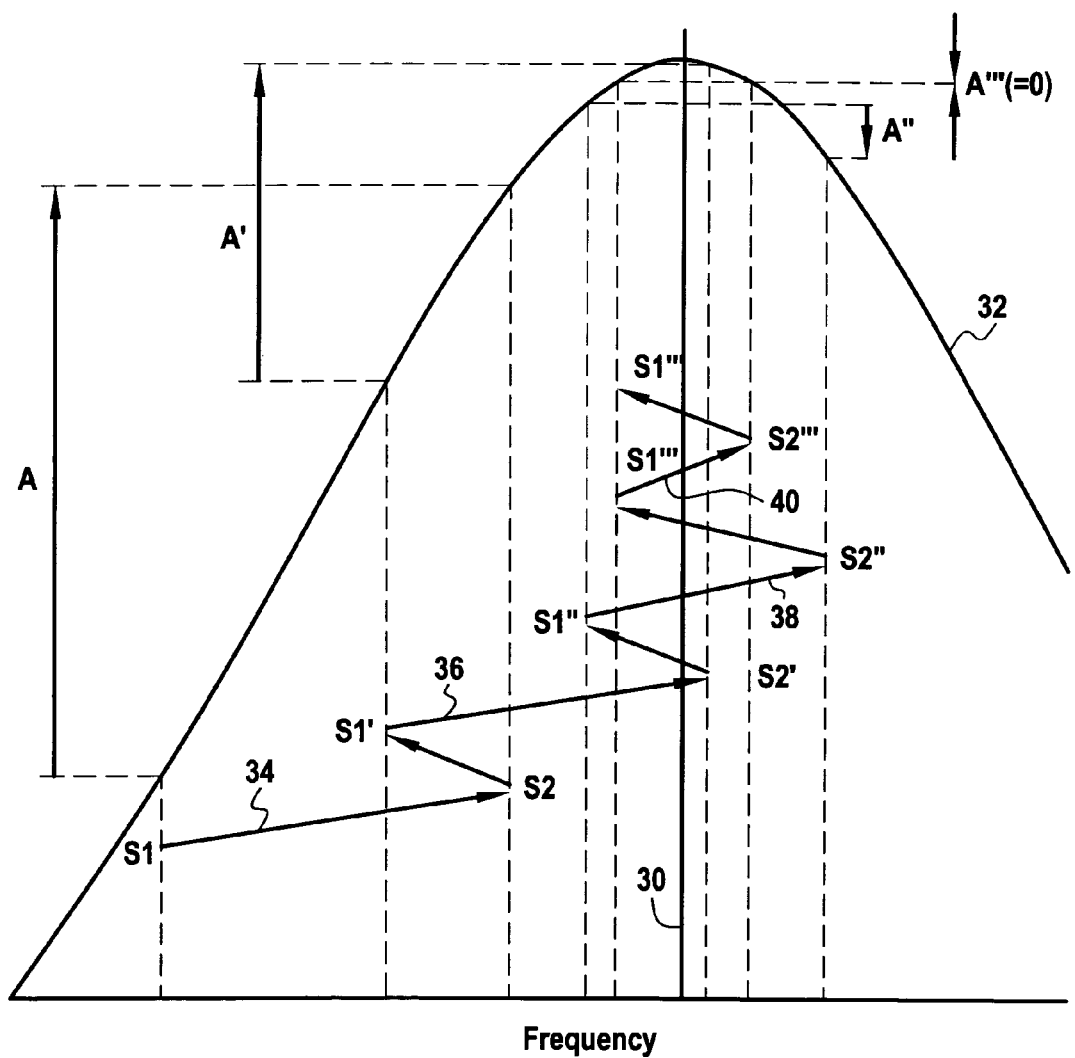
FIG. 3 generally illustrates the relationship between shifting the frequency to which an antenna is tuned and the resultant response.

FIG. 3 generally illustrates the manner in which an antenna can be tuned so as to converge on a desired frequency 30. As in FIG. 2, FIG. 3 illustrates a signal response curve 32 corresponding to a predetermined desired frequency 30. The vertical axis corresponds to any known response parameter that is a maximum when the antenna is tuned to frequency 30, such as gain.

FIG. 3 illustrates several pairs of frequency shifts S1, S2; S1', S2'; S1", S2"; and S1''', S2'''.

Each frequency shift corresponds to a change in the signal response. For example, the shift from S1 to S2 corresponds to the signal response change indicated at A; S1' to S2' at A'; S1" to S2" at A"; and S1''' to S2''' at A'''.

In general, a given frequency shift corresponds to a change in signal response of a certain magnitude and sense. For example, the shift from S1 to S2 corresponds to a positive change A (that is, an increase in signal response). It will be apparent that the magnitude of A corresponds, for a given signal response curve 32, to the extent of the frequency shift from S1 to S2. Also, the sense of A can change. For example, a shift from S2 to S1 would correspond to a negative change A in the signal response.

These relationships can be used as follows to iteratively arrive at a maximum of the signal response curve, so as to tune an antenna to a desired frequency.

For a given frequency 30 and signal response curve 32, the tuning of an antenna is considered with respect to a starting frequency S1, as shown in FIG. 3.

The tuning of the antenna is shifted by an arbitrary amount to S2, as discussed above. This results in a corresponding change in signal response indicated by A in FIG. 3. It will be clear to one of skill in the art that the change in signal response depends at least on the shape of the signal response curve and the extent of the frequency shift 34 between S1 and S2.

It will be appreciated that a positive change in signal response generally indicates that the frequency shift is moving towards the frequency at which the signal response is maximal (i.e., towards the desired frequency 30). An exception would be if the frequency is shifted past frequency 30 but to a frequency at which the signal response is still higher than the initial frequency. However, the iterative use of frequency shifts as explained herein addresses this issue, as will be seen below.

The next frequency shift 36 is between S1' and S2', as seen in FIG. 3. S1' is a frequency that is somewhat lower than S2 in the prior frequency shift, but always higher than S1, so as to obtain, in effect, an overlap of frequencies. The shift from S1' to S2' corresponds to a change in signal response A'.

The extent of the overlap (i.e., the locating of a new first frequency for a subsequent frequency shift) may depend on, among other things, whether a change of sense occurs in the change of signal response in the prior frequency shift and/or the magnitude of the change of signal response in the prior frequency shift.

A third frequency shift 38 from S1" to S2" starts at a frequency somewhat lower than S2'. This frequency shift corresponds with a negative change in signal response A". It will be also noted that the rate of change (or mathematical slope) in the signal response curve 32 over the frequencies between S1" and S2" is relatively smaller than with respect to the frequency shift 34 from S1 to S2 or the frequency shift 36 from S1' to S2'. Accordingly, the magnitude of A" is correspondingly smaller than A or A'.

Because A" is negative for the first time, it can be distinguished that the sweep has passed over frequency 30 to the frequency range to the right thereof, as seen in FIG. 3. This is a factor in the selection of the S1'" to S2'" sweep relative to S1" to S2". Note in particular in FIG. 3 that the magnitude of S1'" to S2'" is selected to be smaller than S1" to S2", and that the former does not overlap the latter, but is instead within the boundaries of the latter.

S1'" to S2'" corresponds to a change A'" of zero, indicating no relative difference in response. Here, S1'" and S2'" are centered on frequency 30, and the frequency shift 40 crosses over beyond frequency 30 to the other side of signal response curve 32. As can be seen in the figure, the signal response at S1'" is the same as that at S2'" (even though the response at S2'" is with respect to the downward sloping side of the signal response curve 32). As a result the change in signal response at A'" becomes zero, which, as mentioned above, indicates that the frequency shift is centered on the desired frequency 30.

If frequency shifts are periodically repeated between S1'" and S2'" (suggested by the "return" 42 to S1'" from S2'" in FIG. 3) (or, alternatively, any other frequency shift centered on frequency 30), the change in signal response should remain zero as long as the tuning remains stable and/or unaffected by external factors, as discussed below. If a change in signal response is detected, the above-described iterative tuning process can be started again.

The number of frequency shifts before "locating" frequency 30 in FIG. 3 is strictly by way of example. The relative magnitudes of the frequency shifts are also strictly by way of example. Specific mention is made of the fact that the frequency shifts are not necessarily equal in magnitude. In addition, the iterative process is completely feasible from the opposite side of frequency 30 (that is, to the right of frequency 30 as seen in FIG. 3), so as to use a plurality of negative or decreasing frequency shifts while comparing changes in signal response.

Figure 4:
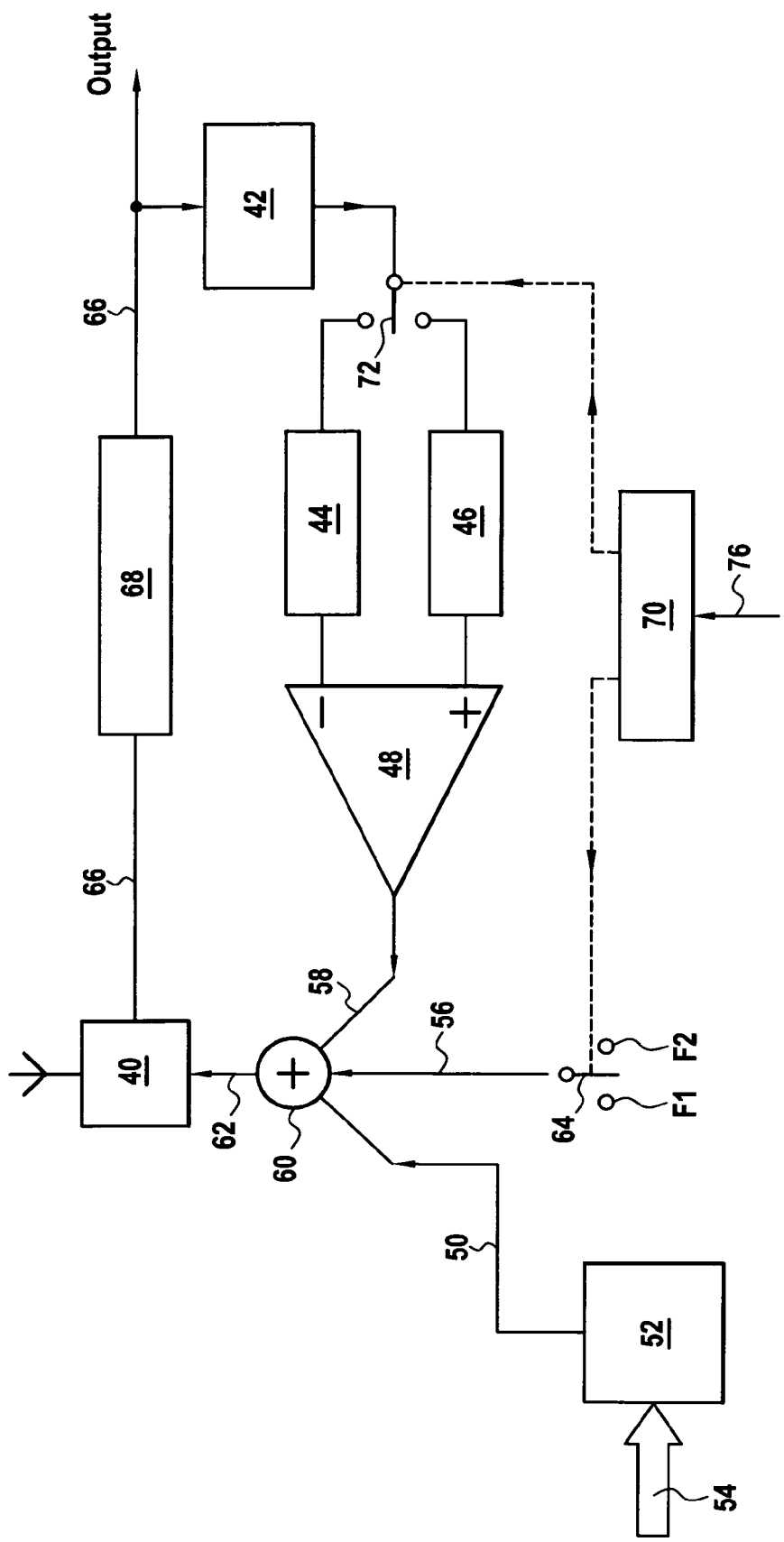
FIG. 4 is a general block diagram of an embodiment of the present invention, given by way of example.

FIG. 4 is a block diagram illustrating an embodiment of the present invention by way of example.

In general, a tunable antenna 40 is shifted between frequencies F1 and F2. At each frequency F1, F2, the resultant signal response is measured by a level detector 42 and stored at storage 44, 46 respectively. The values stored in 44, 46 are compared by a comparator 48. The antenna 40 is then retuned according to an output from comparator 48.

More particularly with respect to FIG. 4, the tuning of antenna 40 is controlled by a combination of signals: an antenna tuning signal 50 generated by an antenna tuning signal generator 52 (optionally controlled by an external control signal 54); an antenna tuning modulation signal 56 corresponding to a respective one of frequencies F1 and F2; and an antenna tuning correction signal 58 corresponding to the output from comparator 48. This combination of signals 50, 56, 58 is combined at adder 60 to provide an applied antenna tuning signal 62 that controls the tuning of antenna 40.

The antenna tuning modulation signal 56 is switched between F1 and F2 by, for example, a switch 64. It is noted that F1 and F2 most generally indicate two frequencies different from one another.

Once tuned to a certain frequency, the antenna 40 outputs a received signal 66, which may optionally undergoing one or more forms of signal processing 68 not germane to the present invention.

The output signal 66 is analyzed by level detector 42 to determine, for example, the level of the signal 66 itself. Alternatively, the level of some conventional signal parameter corresponding to and directly affected by the signal 66 may be determined. The conventional signal parameter may be, for example and without limitation, a bit error rate, a packet error rate, a signal to noise ratio, and the like. Determining a signal level or a parameter level in this manner is deemed to be known to a person skilled in the art and does not itself form part of the present invention.

The output of level detector 42 is selectively provided to one of storage 44 and storage 46, according to, for example, a position of switch 72. The setting of switch 72 depends at least in part on the setting of switch 64, so that, for example, an output corresponding to frequency F1 (based on the setting of switch 64) is stored in storage 44 (according to the setting of switch 72), whereas the output corresponding to frequency F2 would be stored in storage 46.

Accordingly, it is desirable to synchronize switches 64 and 72 by providing a synchronizing means 70 that may, for example, operate in correspondence with an external synchronization control signal 76. In addition, sample and hold techniques may be used to permit storage of the signal response (or parameter response) values before comparison.

Figure 5:
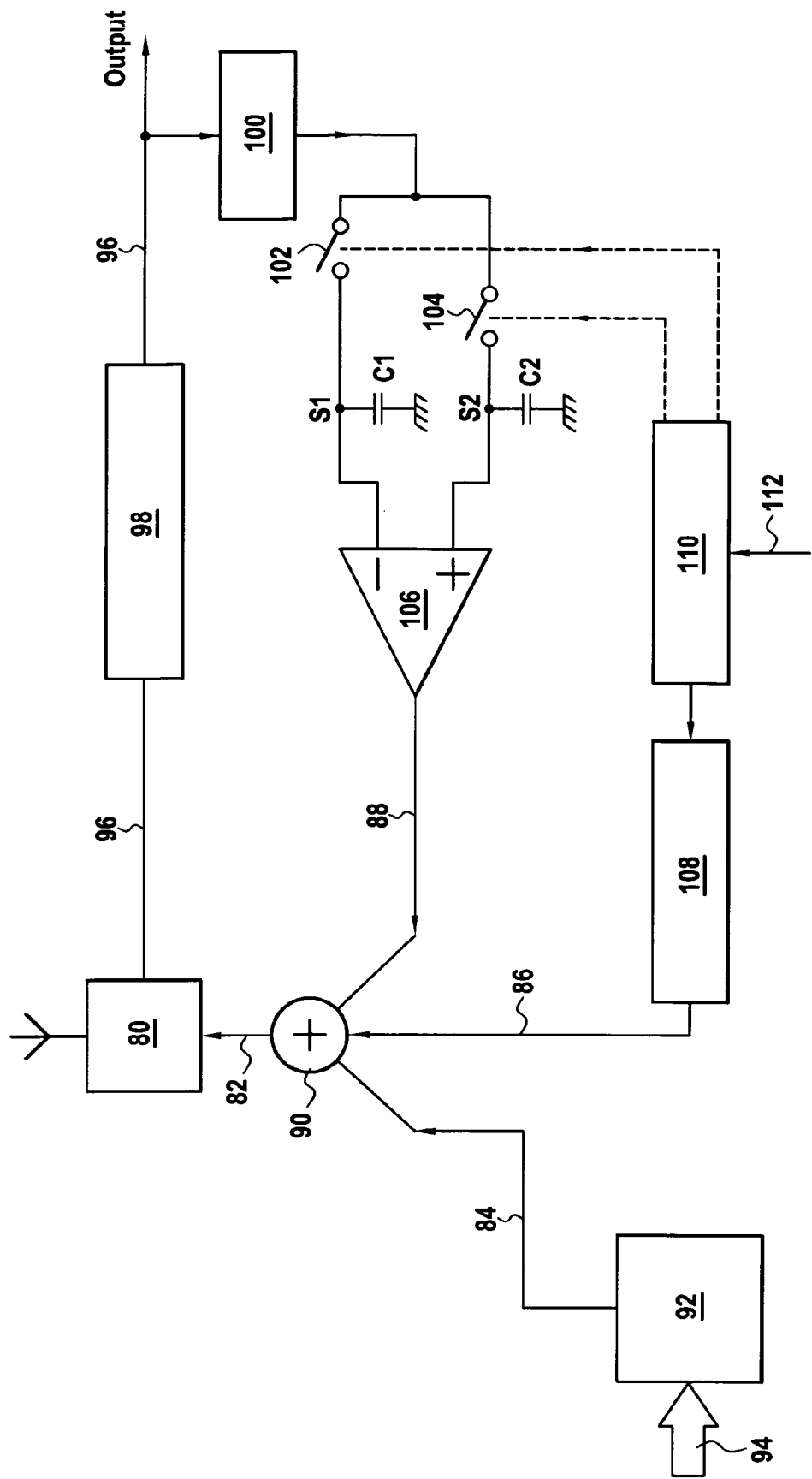
FIG. 5 is an embodiment of the present invention using analog storage, given by way of example.

FIG. 5 is a block diagram illustrating an example implementation of an embodiment of the present invention that is somewhat similar to the arrangement shown in FIG. 4.

Several aspects of the arrangement illustrated in FIG. 5 are sufficiently similar to those of FIG. 4 that the like features are merely identified here without a repeated detailed description.

A tunable antenna 80 is tuned in accordance with a received applied antenna tuning signal 82. The applied antenna tuning signal 82 is an electrical combination of an approximate antenna tuning signal 84, an antenna tuning modulation signal 86, and an antenna tuning correction signal 88, combined by an adder 90. The approximate antenna tuning signal 84 is generated by an antenna tuning signal generator 92 in accordance with an applied control signal 94.

In this arrangement, generally, a received signal 96 is output from antenna 80 (with or without optional conventional signal processing 98) for output as the desired signal. A signal level or a level of a parameter corresponding to and affected by the signal (such as, for example and without limitation, a bit error rate, a packet error rate, and a signal to noise ratio) is detected by level detector 100 using conventional electrical methods. Respective values of the detected levels S1, S2 are stored, in an analog implementation, by capacitors C1 and C2 by opening and closing corresponding switches 102, 104, respectively, in a known fashion at appropriate occasions.

A comparator 106 (which can be, for example, a differential amplifier) compares the respective stored samples and the comparison result becomes the antenna tuning correction signal 88.

In a particular embodiment of the present invention, an antenna (which may be correctly tuned as desired) is periodically and intentionally "detuned" in accordance with the foregoing description. This is done to verify the tuning of the antenna. That is, an antenna (particularly, but not necessarily only, a mobile antenna) can become detuned by external factors, such as proximity to conductive objects. Therefore, in order to verify that the antenna is correctly tuned, a frequency shift, centered on a desired frequency (such as frequency 30 in FIG. 3), is applied. If a net change in signal response occurs, it indicates that the frequency range is no longer centered on a desired frequency and that the antenna is therefore "out of tune." For example, see frequency shift 42 in FIG. 3, as discussed above.

Theoretically, these self-induced frequency shifts can undesirably disturb the output signal. This problem can be reduced by making the transition between the ends of the frequency shift continuous (or otherwise gradual) instead of discrete (as with discrete switching between F1 and F2 using switch 64, as seen in FIG. 4).

Figure 6:
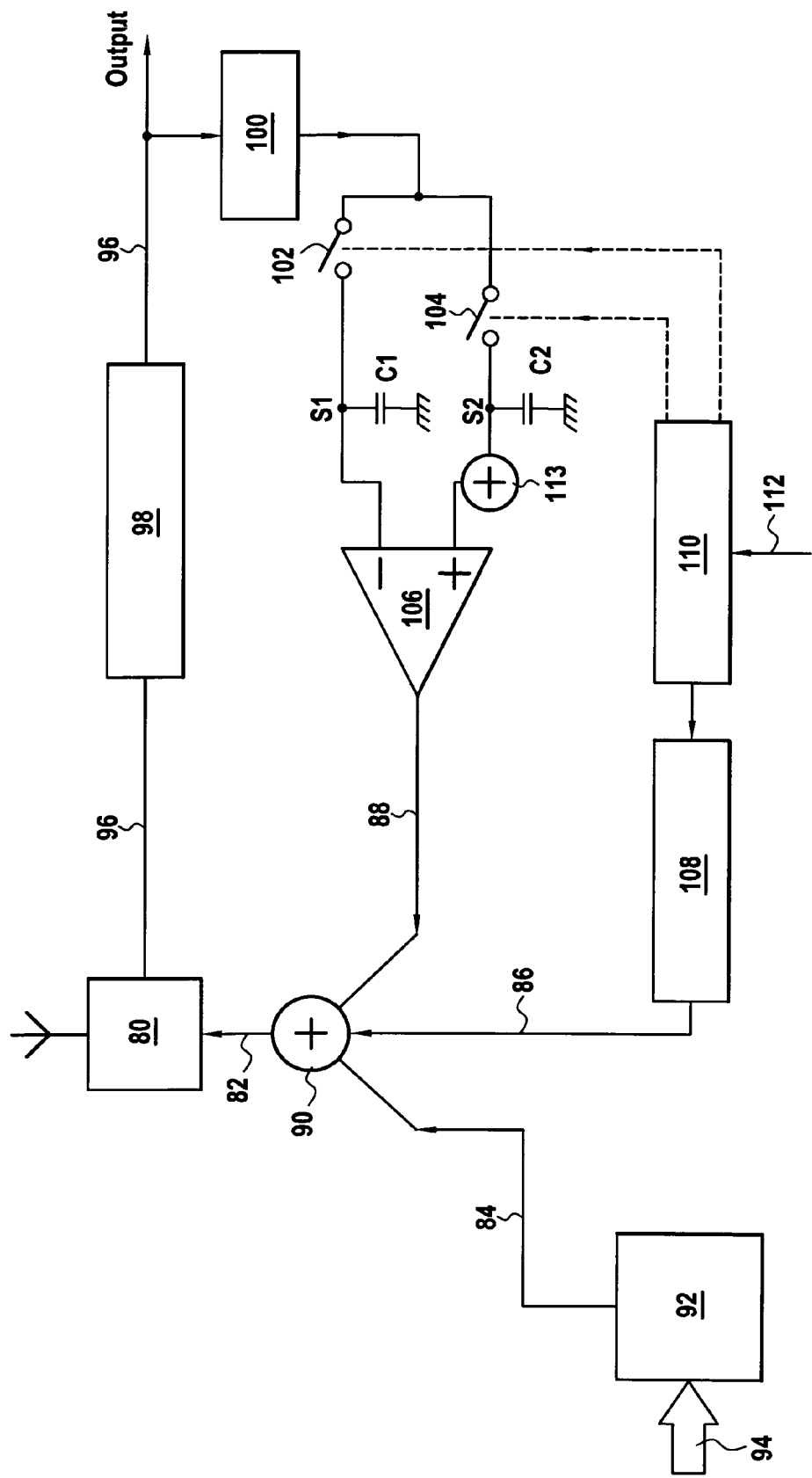
FIG. 6 is an embodiment of the present invention using a frequency shift, given by way of example.

To address this issue, example embodiments of the present invention as illustrated in FIGS. 5 and 6 may include, for example, a conventional ramp generator 108 for generating a continuous alternating antenna tuning modulation signal 86. The waveform of the antenna tuning modulation signal 86 is not particularly critical to the invention, but, for example, a triangular waveform is technically simple to generate.

The operation of switches 102, 104 is preferably synchronized with that of ramp generator 108 using a synchronization unit 110 (that may be controlled by an external control signal 112).

In an analog TV application, it may be desirable to synchronize the modulation signal transition and level sampling periods with the picture field frequency. In this way, the level sampling can take place during the vertical blanking period of the image so that the above-mentioned disturbances to the picture and/or sound are invisible and/or inaudible.

Also, by making the transition period long (e.g., several field periods) the risk of disturbing the sound signal is reduced. As the shifting of the antenna because of external factors is slow, it is possible (particularly in implementations using digital storage or software) to carry out a correction cycle only periodically (instead of continuously). This further reduces the possibility of disturbing the signal when it is carried out at a non-critical time (such as during a program change).

Disturbing the output signal as described here may only be an annoyance at worst, depending on the situation, such that the aforementioned solutions can be reasonably considered useful but optional to the present invention.

Figure 10:
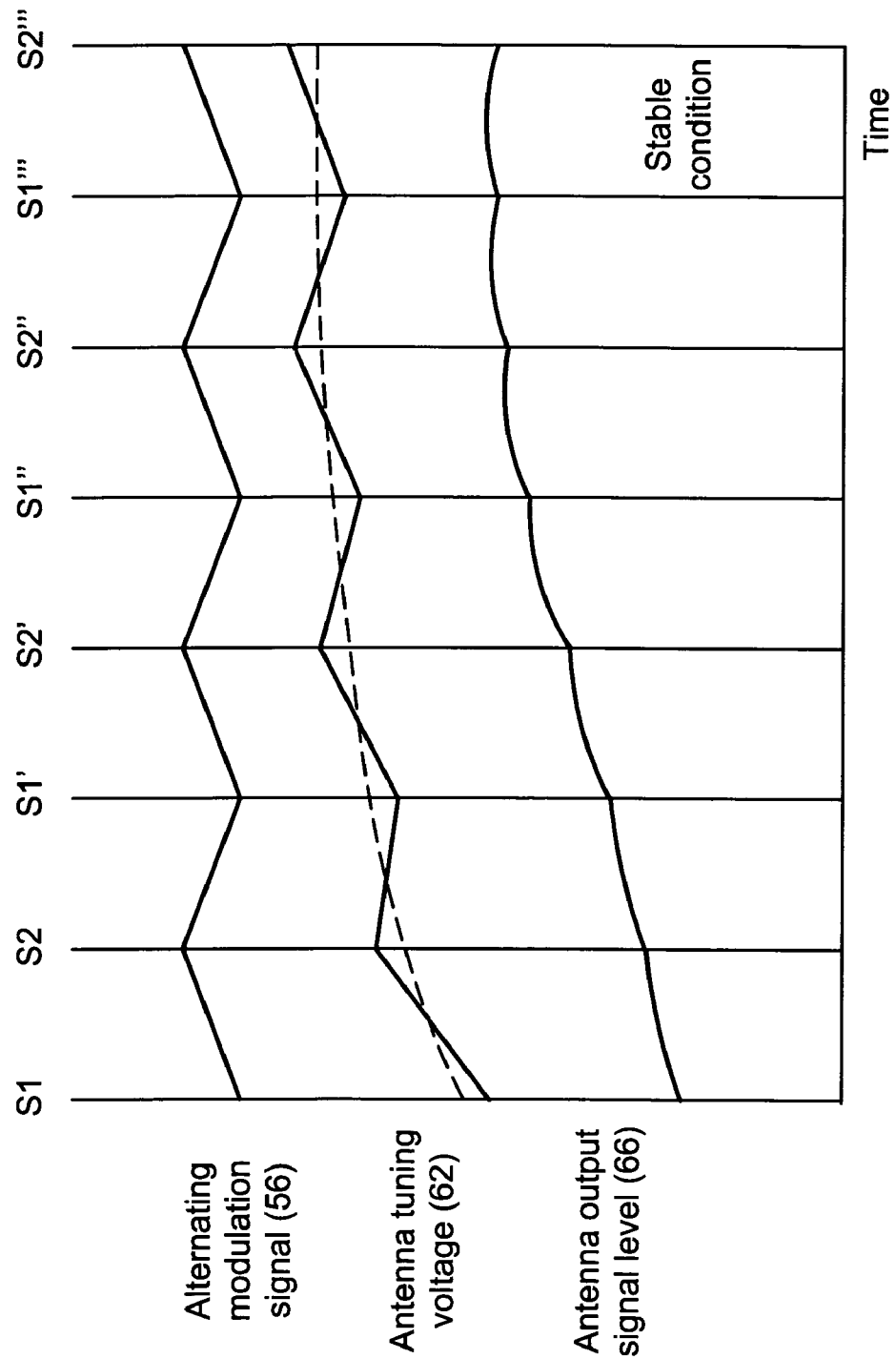
FIG. 10 illustrates spurious modulation of the output signal during detuning.

Taking into account FIG. 10 with respect to FIGS. 3 and 4 as discussed above, there will be an additional amplitude modulation of the antenna output signal level 66 as seen in FIG. 10, even with a gradual transition. The amount of amplitude modulation of the antenna output will depend on the frequency shift applied to the antenna. Reducing the magnitude of the frequency shift could reduce the amplitude modulation added to the signal, but it could also reduce the sensitivity and precision of the tuning system.

The signal processing in a DVB tuner architecture often includes an automatic gain control (AGC), as was shown in FIG. 1.

Figure 9:
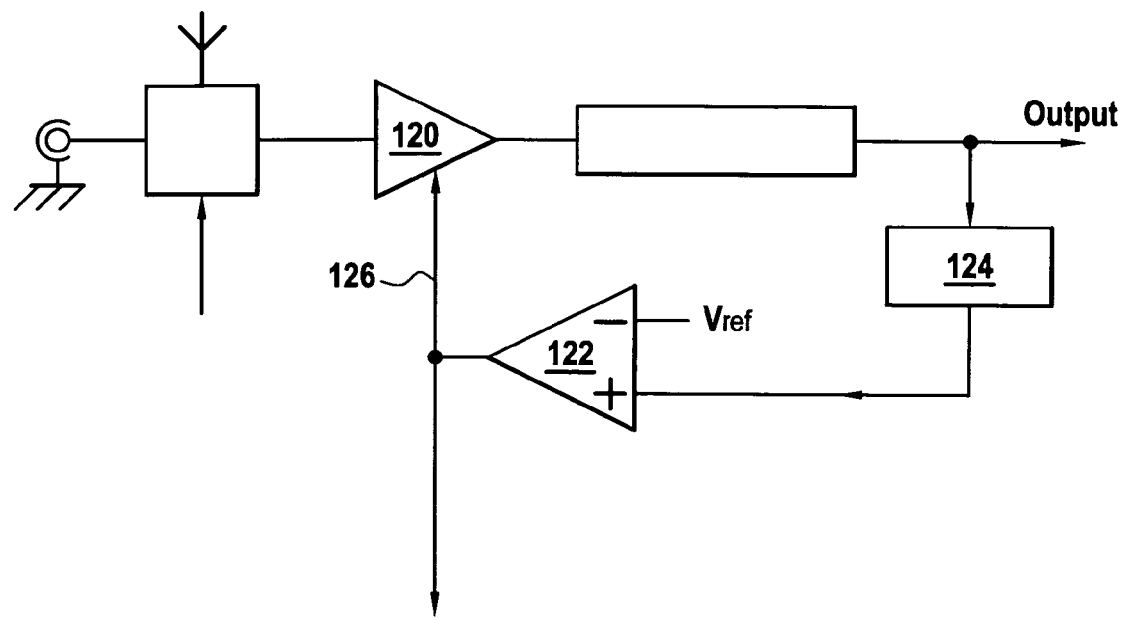
FIG. 9 illustrates an embodiment of the present invention, given by way of example, that obtains response level detection from the use of automatic gain control.

As seen in more detail in FIG. 9, one or more variable gain amplifiers 120, 122 are placed in the signal path. The signal level at the output of the system is measured by level detector 124 and an error signal 126 (with respect to a reference voltage $V_{ref}$) is applied to the variable gain amplifier 120 to maintain the level of the signal constant. The invention can use the error signal 126 as a measure corresponding to the signal level. If the AGC system is able to react fast enough, it can remove the amplitude modulation caused by the shifting of the antenna center frequency with the tuning modulation signal of the sort illustrated at the bottom-most part of FIG. 10.

In many applications, the signal received by the antenna is not a simple carrier and its bandwidth may be only slightly narrower than that of the antenna. Accurate centering of the antenna therefore becomes very important.

Figure 7A:
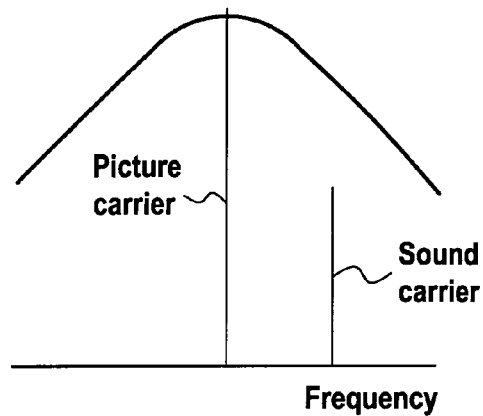
FIGS. 7a-7d illustrate applications of the invention to various signal types.
Figure 7B:
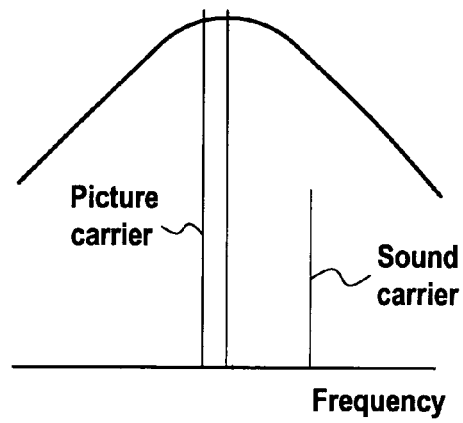

For example, an analog TV signal consists of a picture carrier and sound carrier whose power is about a tenth that of the picture carrier. Depending on the transmission standard, the sound carrier can be 4.5, 5.5, 6.0, or 6.5 MHz higher in frequency than the picture carrier. If the level detector only measures the level of the picture carrier, the antenna center frequency will be positioned on the picture carrier as shown in FIG. 7A. However, if the total power is measured (i.e., taking into account both the picture and sound carriers), the system will tend to center the antenna response nearer to the center of the complete signal, as shown in FIG. 7B.

Figure 7C:
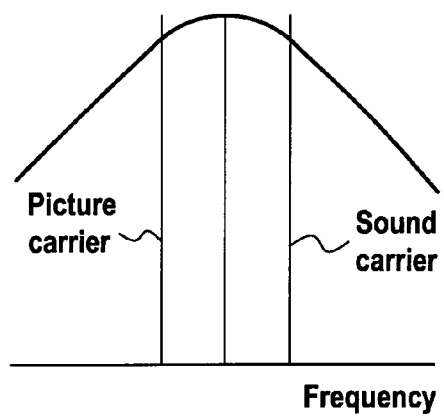
Figure 7D:
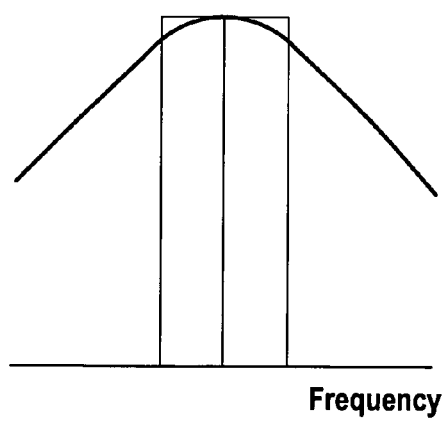

Perfect centering can only be achieved when the two carriers have the same amplitude (FIG. 7C). In the case of a complex signal with a Gaussian or rectangular spectrum, measuring the total power will also achieve correct alignment, as seen, for example, in FIG. 7D.

It is also possible to shift the centering of the antenna. This can allow the antenna response to be centered on an asymmetrical signal, such as that seen in FIG. 8.

The simplest method of introducing such shifting is to add an offset 113 at the input of the comparator 106, as seen in FIG. 6 (which is in all other respects identical to FIG. 5 such that the other features therein are therefore likewise numbered).

In the above description only the signal level has been considered. When there is a strong disturbing signal close to the desired signal, the tuning of the antenna can be disturbed. For example, when a digital TV signal is adjacent to an analog TV signal that may be 30 or 40 dB stronger than the desired digital signal, the digital signal can be disturbed. In this case it may be advantageous to use information other than the signal level, such as bit error rate (BER), packet error rate (PER), or signal to noise ratio (C/N), which all would give more accurate information about the received signal than the signal level. Most generally, in a digital TV decoder, this information is often available and can be used to tune the antenna such that the effect of the adjacent disturbing signal is minimized.

Figure 8:
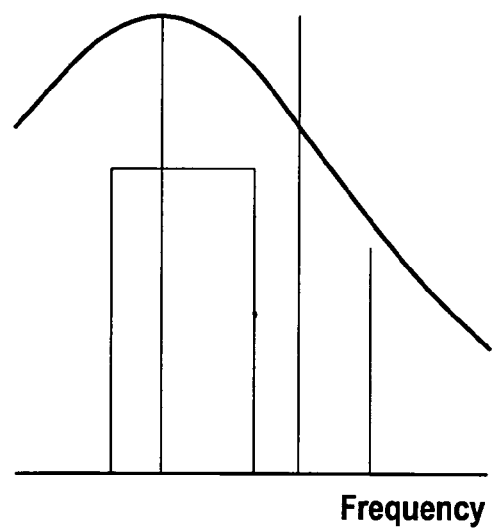
FIG. 8 illustrates an example of a signal of interest affected by an adjacent signal on the spectrum.

As seen in FIG. 8, the optimum antenna tuning may not occur in this case when the antenna response is centered on the desired signal. The frequency response of the antenna can provide additional "filtering" of the disturbing signal. In spite of some distortion to the desired signal, the best BER, for example, can occur with the antenna center frequency shifted away from the disturbing signal. The maximum of the parameter being considered is always sought, whether it is signal level, PER, BER, etc. This information may be used in place of the signal level or in addition to the signal level to optimize the tuning of the antenna.

Although the present invention has been described above with reference to certain particular preferred embodiments, it is to be understood that the invention is not limited by reference to the specific details of those preferred embodiments. More specifically, the person skilled in the art will readily appreciate that modifications and developments can be made in the preferred embodiments without departing from the scope of the invention as defined in the accompanying claims.

The invention claimed is:

1. A method for tuning an antenna to a desired signal frequency at which a given signal has a maximal response, comprising:
   detecting a first response of the antenna at a first frequency to which the antenna is tuned;
   detecting a second response of the antenna at the second frequency to which the antenna is tuned that is different from the first frequency;
   comparing the first response and the second response;
   changing the frequency to which the antenna is tuned based on the comparison of the first response and the second response;
   wherein the steps of detecting the first and second responses, comparing the first and second responses, and changing the frequency to which the antenna is tuned based on the comparison are performed iteratively so as to progressively move the frequency to which the antenna is tuned to the desired signal frequency;
   wherein changing the frequency to which the antenna is tuned based on the comparison of the first response and the second response comprises selecting a magnitude of a change in frequency of the antenna based on the comparison of the first response and the second response.

2. A method according to claim 1, wherein changing the tuning of the antenna based on the comparison of the first response and the second response comprises changing the tuning of the antenna to a higher frequency or to a lower frequency based on the comparison of the first response and the second response.

3. A method according to claim 2, wherein the first and second responses are the signal levels of the given signal at the first and second frequencies, respectively.

4. A method according to claim 2, wherein the first and second detected responses are any one of the bit error rate level, the packet error rate level, and the signal to noise ratio level.

5. A method according to claim 2, wherein changing the tuning of the antenna based on the comparison of the first response and the second response is performed automatically.

6. A method according to claim 1, wherein the first and second responses are the signal levels of the given signal at the first and second frequencies, respectively.

7. A method according to claim 6, wherein changing the tuning of the antenna based on the comparison of the first response and the second response is performed automatically.

8. A method according to 6, wherein, when no relative change is detected between the first response and the second response, the desired signal frequency is centered between the first frequency and the second frequency such that the antenna can be tuned thereto.

9. A method according to claim 1, wherein the first and second detected responses are any one of the bit error rate level, the packet error rate level, and the signal to noise ratio level.

10. A method according to claim 1, wherein changing the tuning of the antenna based on the comparison of the first response and the second response is performed automatically.

11. A method according to 10, wherein, when no relative change is detected between the first response and the second response, the desired signal frequency is centered between the first frequency and the second frequency such that the antenna can be tuned thereto.

12. A method according to claim 1, wherein, when no relative change is detected between the first response and the second response, the desired signal frequency is centered between the first frequency and the second frequency such that the antenna can be tuned thereto.

13. A method according to claim 12, further comprising, after tuning the antenna to the desired signal frequency, shifting the frequency to which the antenna is tuned above and below the desired signal frequency to determine if the antenna is still tuned.

14. A method according to claim 13, wherein shifting the frequency to which the antenna is tuned above and below the desired signal frequency to determine if the antenna is still tuned comprises continuously shifting the frequency.

15. A system for tuning an antenna to a desired signal frequency at which a given signal has a maximal response, comprising:
    a level detector to determine a first response at a first frequency to which the antenna is tuned and to determine a second response at a second frequency to which the antenna is tuned that is different from the first frequency;
    a comparator to compare the first and second responses, the comparator comprising an output to provide a tuning control signal for iteratively changing a frequency to which the antenna is tuned based on the comparison between the first and second responses so as to progressively move the frequency to which the antenna is tuned to the desired signal frequency, wherein changing a frequency to which the antenna is tuned comprises selecting a magnitude of the change in frequency of the antenna based on the comparison of the first response and the second response.

16. A system according to claim 15, further comprising a frequency offset for adding a fixed frequency offset to one of the first and second responses.

17. A system according to claim 15, further comprising a control module to, after tuning the antenna to the desired signal frequency, shift the frequency to which the antenna is tuned above and below the desired signal frequency to determine if the antenna is still tuned.

18. A system according to claim 17, an adder to add an alternating modulation signal to the tuning control signal.

19. A system according to claim 18, wherein the alternating modulation signal has a triangular waveform.

20. A system according to claim 17, the control module to continuously shift the frequency to which the antenna is tuned to determine if the antenna is still tuned.

* * * * *